(12) United States Patent
Habert et al.

(10) Patent No.: US 9,487,045 B2
(45) Date of Patent: Nov. 8, 2016

(54) ELEMENT HAVING A DECORATIVE SURFACE

(75) Inventors: Cédric Habert, Le Fay Saint Quentin (FR); Nicolas Pegorier, Parmain (FR)

(73) Assignee: Faurecia Interieur Industrie, Nanterre (FR)

( * ) Notice: Subject to any disclaimer, the term of this patent is extended or adjusted under 35 U.S.C. 154(b) by 395 days.

(21) Appl. No.: 14/116,844

(22) PCT Filed: May 29, 2012

(86) PCT No.: PCT/FR2012/051202
§ 371 (c)(1),
(2), (4) Date: Dec. 6, 2013

(87) PCT Pub. No.: WO2012/164219
PCT Pub. Date: Dec. 6, 2012

(65) Prior Publication Data
US 2014/0087095 A1    Mar. 27, 2014

(30) Foreign Application Priority Data
May 27, 2011   (FR) ..................... 11 54669

(51) Int. Cl.
| | | |
|---|---|---|
| *B44F 1/10* | (2006.01) | |
| *B60R 13/02* | (2006.01) | |
| *B60R 13/04* | (2006.01) | |
| *B32B 3/10* | (2006.01) | |
| *H05K 5/02* | (2006.01) | |

(52) U.S. Cl.
CPC . *B44F 1/10* (2013.01); *B32B 3/10* (2013.01); *B60R 13/02* (2013.01); *B60R 13/04* (2013.01); *H05K 5/0252* (2013.01); *B32B 2451/00* (2013.01); *B32B 2605/003* (2013.01); *Y10T 428/24802* (2015.01)

(58) Field of Classification Search
CPC .............. Y10T 428/24802; Y10T 428/24851; Y10T 428/24868; Y10T 428/24917; B41M 1/08; B41M 1/10; B42D 25/36; B42D 25/373; B42D 25/378
See application file for complete search history.

(56) References Cited

U.S. PATENT DOCUMENTS 5,745,988 A * 5/1998 Hohmann ............ G06K 19/041
                                                      235/488
5,808,758 A * 9/1998 Solmsdorf ............. B41M 3/148
                                                      283/902

FOREIGN PATENT DOCUMENTS

DE    4446368 A1    12/1994
FR    2952585 A1    5/2011

OTHER PUBLICATIONS

International Search Report for related International Serial No. PCT/FR2012/051202; report dated Nov. 9, 2012.

* cited by examiner

*Primary Examiner* — Gerard Higgins
(74) *Attorney, Agent, or Firm* — Miller, Matthias & Hull LLP

(57) ABSTRACT

An element which has a decorative outer surface comprising: a first region having a constant luminance that is equal to a first predetermined value; and one second region adjacent to the first region, wherein the second region has a variable luminance that depends on the viewing angle, the variable luminance of the second region being equal to the first predetermined value for a first given viewing angle.

13 Claims, 2 Drawing Sheets

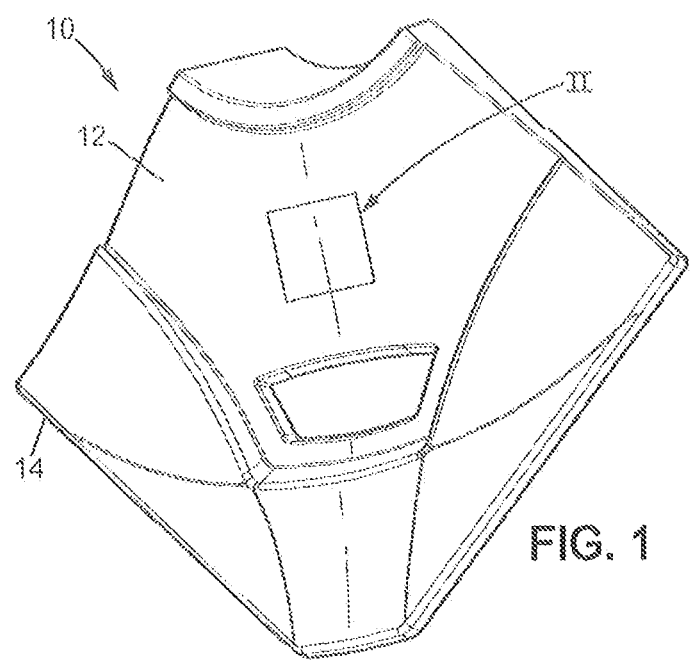
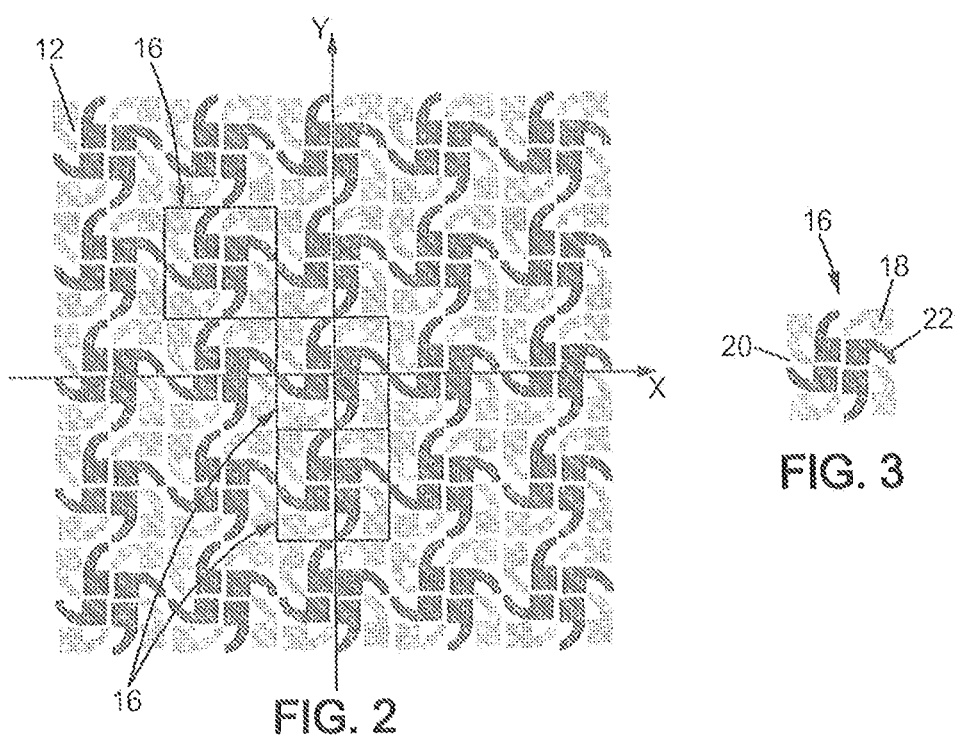

ELEMENT HAVING A DECORATIVE SURFACE

CROSS-REFERENCE TO RELATED APPLICATIONS

This application is a 35 USC §371 U.S. national stage filing of International Patent Application No. PCT/FR2012/051202 filed on May 29, 2012, and claims priority under the Paris Convention to French Patent Application No. FR 11 54669 filed on May 27, 2011.

FIELD OF THE DISCLOSURE

The present invention relates to an element having a decorative outer surface comprising:
a first region having a constant luminance equal to a first predetermined value; and
at least a second region adjacent to the first region.

BACKGROUND OF THE DISCLOSURE

Such elements may be interior trim parts of vehicles, for example such as an automobile dashboard, a center console, inner door panels, etc., or may be simple decorative elements such as medallions or strips arranged on these trim parts. These elements may also be exterior trim parts of a motor vehicle. More generally, it can be any element intended for forming an outer surface of an object such as a housing for an electronic device or a piece of furniture.

SUMMARY OF THE DISCLOSURE

The invention proposes an element whose surface provides a novel visual effect.

To achieve this, the invention relates to an element having a decorative outer surface of the above type, wherein the second region has a variable luminance which depends on the viewing angle, the variable luminance of the second region being equal to the first predetermined value for a first given viewing angle.

Due to these characteristics, the visual appearance of the decorative surface changes significantly with the viewing angle of an observer. For a viewing angle which differs from the first given viewing angle, the first and second regions are clearly distinct with a well-defined boundary, while as this first viewing angle is approached, the two regions and their boundary are much less distinct, and may even be completely merged if the two regions have exactly the same color tone. This results in a more or less pronounced disappearance effect of the image formed by the two adjacent regions. It has been observed that this effect is all the more striking when the regions form a repeating pattern on the decorative surface.

The element according to the invention may comprise one or more of the following characteristics:
the outer surface comprises a third region adjacent to the second region, this third region having a constant luminance that is equal to a second predetermined value, the second predetermined value being different from the first predetermined value, and the variable luminance of the second region is equal to the second predetermined value for a second given viewing angle, the second given viewing angle being different from the first given viewing angle;
the regions have the same color hue;
the regions together form a basic pattern, the outer surface comprising a plurality of patterns identical to the basic pattern and adjacent to each other;
the outer surface is a three-dimensional surface having at least two areas that are simultaneously observable from significantly different viewing angles;
the outer surface is formed by a translucent film having a rear face opposite the outer surface, the regions being formed by materials applied to said rear face; and
the constant luminance of a region substantially corresponds to a minimum or a maximum of the variable luminance of the second region.

The invention also relates to a motor vehicle trim part, characterized in that it comprises an element as described above whose outer surface is visible in the mounted state.

The invention further relates to a method for manufacturing an element having a decorative outer surface, characterized in that it comprises the following steps:
providing a film having a front face and a rear face, and made from a translucent plastic material;
applying, over a first area of the rear face of the film, a first material suitable for forming a first region having a constant luminance equal to a first predetermined value;
applying, over a second area of the film, a second material suitable for forming a second region having a luminance which varies with the viewing angle, the variable luminance of the second region being equal to the first predetermined value for a first given viewing angle; and
shaping the film such that at least a portion of the front face of the film forms the decorative surface.

The method according to the invention may include the characteristic according to which one of the materials is applied over an area corresponding to the entire rear face of the film.

BRIEF DESCRIPTION OF THE DRAWINGS

The invention will be better understood from reading the following description, given solely by way of example and with reference to the accompanying drawings, in which:
FIG. 1 is a perspective view of an element according to the invention;
FIG. 2 is a top view of the detail II of FIG. 1;
FIG. 3 is a view illustrating a basic pattern of the element of FIG. 1.

DETAILED DESCRIPTION OF THE DISCLOSURE

Figure 4:
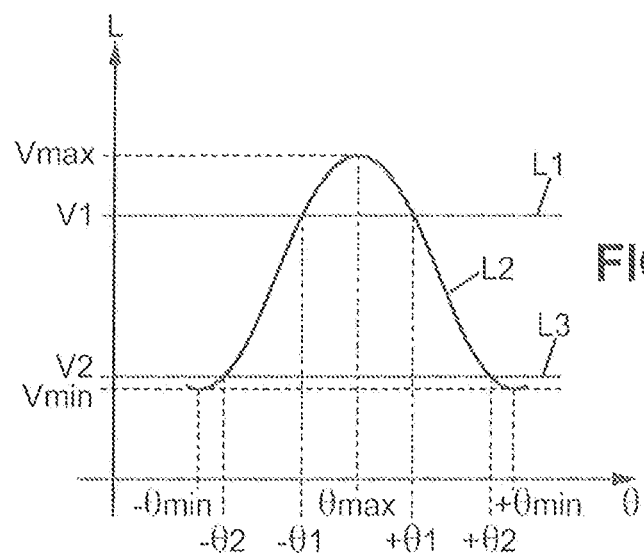
FIG. 4 is a graph showing the luminance as a function of the viewing angle for different regions of the element of FIG. 1.

FIG. 1 represents a decorative element 10, intended for attachment to an automobile dashboard for example.

The decorative element 10 comprises an outer surface 12 visible to an observer and formed by a film 14.

Referring to FIG. 2, the outer surface 12 includes a basic pattern 16 which is repeated over the entire outer surface 12. The outer surface 12 therefore comprises a plurality of basic patterns 16 identical to and adjacent to each other. The basic pattern 16 has an outer contour that is substantially square in shape.

In particular, in a plan view (FIG. 2), the basic pattern 16 is repeated over the outer surface 12 in a first direction X and in a second direction Y.

In the illustrated embodiment, the first and second directions X and Y are substantially perpendicular to each other.

The patterns are thus in a matrix arrangement on the outer surface 12, forming an array of n rows and m columns, n and m being equal to 5 in FIG. 2.

As shown in FIG. 3, the basic pattern 16 is formed by three regions clearly distinct from each other and each having a specific luminance.

Luminance is a photometric quantity used to determine the characteristics of luminous radiations in relation to the visual sensation that they cause.

The luminance L refers to the light intensity of a point on a given surface in a given direction. It can originate directly from a light source, such as a lamp, or be reflected by an illuminated surface. The unit of measurement of luminance is candela per m$^2$ (cd×m$^{-2}$). Thus, in the case of an illuminated surface, the luminance takes into account the reflective properties of the surface.

The basic pattern 16 includes a visible first region 18, formed by a surface adapted to reflect light in a diffuse manner, meaning it is adapted to reflect light in all directions regardless of the angle of incidence at which the surface is illuminated.

The surface of the first region 18 is also adapted to reflect light evenly, meaning with a constant luminance L1 that is independent of the viewing angle $\theta$ of an observer, $\theta$ being defined as the angle between the viewing direction of the observer and the normal to the surface of the first region 18. This surface is then considered as being orthotropic or having Lambertian reflectance.

The luminance L1 depends solely on the illumination of the first region 18 and on the reflectance of the first region 18. In particular, the luminance L1 is directly proportional to the product of the illumination and the reflectance.

For a given illumination, the luminance L1 is equal to a first predetermined value V1 related to the reflectance of the first region 18, as indicated by a horizontal line in FIG. 4. The first region 18 is distinctly visible regardless of the viewing angle $\theta$.

This reflectance is higher when the surface is light in color.

In the embodiment described here, the first region 18 is formed by a surface that is light gray in color.

The basic pattern 16 includes a second region 20 adjacent to the first region 18. Adjacent is understood to mean that at least a portion of the contour of the first region 18 is bordered by the second region 20. Portion is understood to mean a significant part of the contour of the region, for example more than 10%, in order to obtain the visual effect described below. In the non-limiting embodiment represented, the first region 18 is entirely surrounded by the second region 20. The second region 20 is formed by a surface adapted to reflect light at a variable luminance L2 which is dependent on the viewing angle $\theta$.

Referring to FIG. 4, for a given illumination, the luminance L2 reaches a maximum Vmax for a viewing angle $\theta$max which follows the laws of geometrical optics, meaning a viewing angle $\theta$max equal to the angle of incidence at which the surface is illuminated. The reflection of light in this direction is referred to as specular.

The luminance L2 is substantially symmetrical about $\theta$max and gradually decreases as the viewing angle $\theta$ moves away from $\theta$max to reach a minimum Vmin at viewing angle±$\theta$min.

The difference between $\theta$max and ±$\theta$min provides a gradual change in the visual appearance of the second region 20, and therefore in the basic pattern 16 and decorative surface 12, over a wide range of viewing angles [−$\theta$min; +$\theta$min].

In particular, the luminance L2 of the second region 20 is equal to the predetermined first value V1 of the luminance L1 of the first region 18 for a first viewing angle±$\theta$1.

In the embodiment described here, the second region 20 is formed by a surface having a silver metallic appearance, meaning it is gray in hue.

The basic pattern 16 includes a third region 22 adjacent to the second region 20 (FIG. 3). Similarly to the first and second regions 18, 20, adjacent is understood to mean that the second and third regions 22, 20 have at least a portion of their contour in common. In addition, the third region 22 is separate from the first region 18 in the embodiment shown. Separate is understood to mean that no portion of the contour of the first region 18 is shared with the third region 22. However, it is quite possible to have the first and third regions be adjacent, meaning with a significant portion of their respective contours being adjacent, as long as each of these first and third regions also have a significant portion of their contour that is adjacent to the second region.

The third region 22 is formed by a surface adapted to reflect light in a diffuse manner. The surface of the third region 22 is adapted to reflect light uniformly with a constant luminance L3 that is independent of the viewing angle $\theta$ of an observer. Similarly to the first region 18, the luminance L3 depends solely on the illumination of the third region 22 and on the reflectance of the third region 22. In particular, the luminance L3 is directly proportional to the product of the illumination and the reflectance.

For a given illumination, the luminance L3 is equal to a second predetermined value V2 related to the reflectance of the third region 22, as indicated by a horizontal line in FIG. 4. This third region 22 is distinctly visible regardless of the viewing angle $\theta$.

This reflectance is lower when the surface is darker in color.

In the embodiment described here, the third region 22 is formed by a surface that is dark gray in color. The predetermined luminances of the first and third regions 18, 22 are therefore different. For reasons which will be apparent below and which are related to the desired visual effect, it must be a visible difference. Visible difference is understood to mean that a human observer can easily distinguish a difference in the appearance of these regions 18, 22 regardless of the viewing angle.

For a second viewing angle±$\theta$2, the luminance L2 of the second region 20 is equal to the second predetermined value V2 of the luminance L3 of the third region 22.

Figure 5:
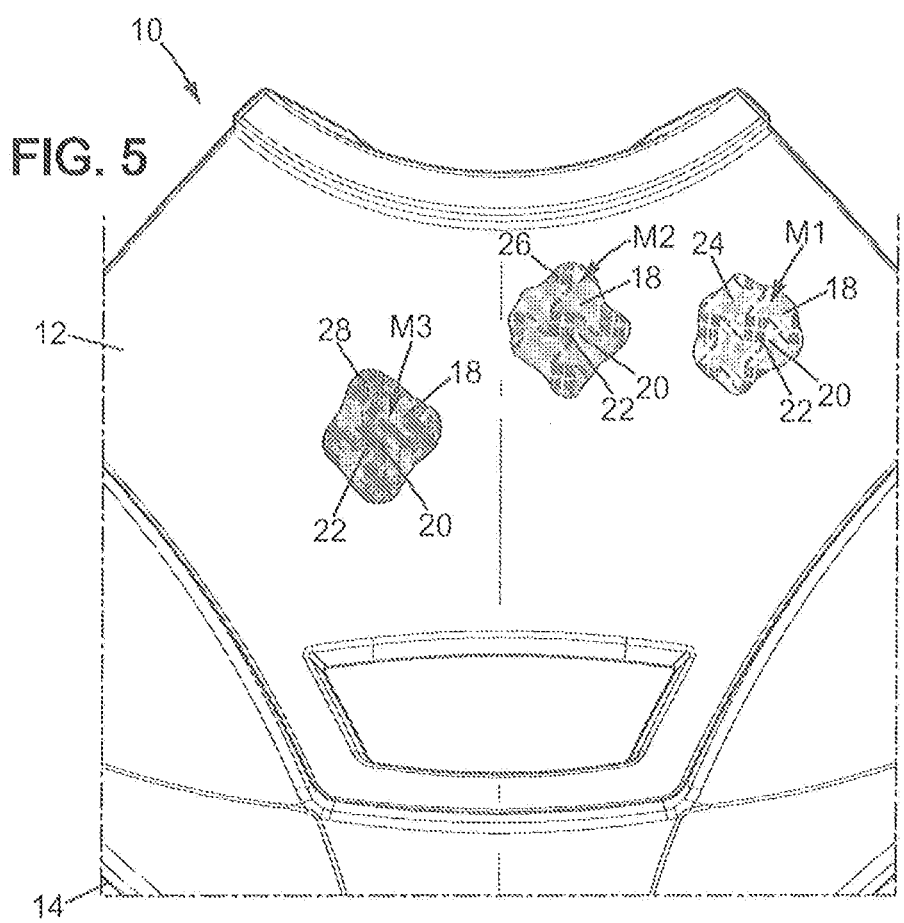
FIG. 5 is a top view of the element of FIG. 1, schematically illustrating different patterns obtained from the basic pattern of FIG. 3.

The decorative surface 12 of the element 10 produces the following effects, explained in reference to FIG. 5.

When an observer is positioned at a viewing angle $\theta$ equal to $\theta$max relative to a first portion 24 of the decorative element 10, the observer sees in this first portion 24 at least a first visual pattern M1 identical to the basic pattern 16.

This first pattern M1 therefore includes the first visible region 18 of luminance L1 equal to V1 and light gray in color, the third visible region 22 of luminance L3 equal to V2 and dark gray in color, and the second region 20 of luminance L2 equal to Vmax and substantially white in color. The three regions 18, 20, 22 are then clearly distinct visually.

When the observer is positioned at a viewing angle $\theta$ equal to ±$\theta$1 relative to a second portion 26 of the decorative element 10, the observer sees in this second portion 26 the first region 18 of luminance L1 equal to V1 and light gray in color, the third region 22 of luminance L3 equal to V2 and dark gray in color, and the second region 20 of luminance L2 equal to V1 and light gray in color.

The boundary between the first region 18 and the second region 20 gradually fades as the observer moves from θmax to ±θ1. In the embodiment described, these regions then combine because the same gray hue was adopted for regions 18 and 20 which are then both light gray in color, while the third region 22 is clearly distinct due to its dark gray color. However, even with non-identical color hues, such as orange or brown hues associated with a second region that is metallic copper in appearance, a significant visual effect can be seen from this second viewing angle as the difference in the appearance of the first and second regions gradually fades. Thus at least a second visual pattern M2 is obtained that is different from the first visual pattern M1.

When the observer is positioned at a viewing angle θ equal to ±θ2 relative to a third portion 28 of the decorative element 10, the observer sees in this third portion 28 the first region 18 of luminance L1 equal to V1 and light gray in color, the third region 22 of luminance L3 equal to V2 and dark gray in color, and the second region 20 of luminance L2 equal to V2 and dark gray in color.

Thus the boundary between the third region 22 and the second region 20 gradually fades when the observer moves from ±θ1 to ±θ2, these regions combining for the embodiment being described, while the first region 18 is clearly visible and distinct from the second region 20. Thus a third visual pattern M3 is obtained that is different from the first pattern M1 and different from the second pattern M2.

When the observer is positioned at a viewing angle θ that is different from θmax, from ±θ1 and from ±θ2, the observer sees a pattern substantially identical to the basic pattern 16 but with a second region 20 of luminance L2 differing from Vmax, from V1 and from V2 and therefore of a lighter or darker color.

From a single basic pattern 16, at least three different visual patterns M1, M2 and M3 are therefore observable. It is understood that the viewing angle is changed when the observer moves relative to the decorative element 10, which produces an unusual visual effect even when the outer surface 12 is relatively flat. But the shape of the element 10 itself produces surprising visual effects due to the complex three-dimensional shape of the decorative surface 12. Indeed, two spaced-apart areas of this surface 12 cannot be observed simultaneously from the same angle by an observer positioned at a distance that is reasonable for identifying patterns. The outer surface 12 therefore appears to be decorated differently between these areas, although the basic pattern 16 is the same over the entire surface.

The decorative element 10 is made from a film 14 of transparent or translucent plastic material, of a thickness substantially equal to 400 μm for example.

A first pigmented ink is printed, for example by screen printing, onto the rear face of the film intended for forming the inner surface of the decorative element 10, and onto areas intended for forming the first region 18 of the plurality of basic patterns 16. The ink can be matte or glossy. However, its appearance on the front face, meaning through the film, will be of varying brightness depending on the surface state of the film.

A second pigmented ink is then applied in the same manner on areas intended for forming the third region 22 of the plurality of basic patterns 16.

A third ink for providing a metallic appearance is then applied in the same manner but across the entire rear surface of the film. This ensures that no area of the film is devoid of ink.

Finally the film is shaped, for example by thermoforming, so that the front face of the film 14 constitutes the outer surface 12.

The shaped film 14 may be the decorative element 10. Most often, however, the film 14 is secured to a support, for example by bonding or by injection-molding plastic material onto the rear face of the film.

The invention therefore proposes a decorative element for obtaining a visual effect which changes according to the angle at which it is viewed.

In particular, the decorative element of the invention allows obtaining different patterns from a single basic pattern.

In the above description, the basic pattern 16 of the decorative element 10 comprises three visibly different regions 18, 20, 22, namely two separate regions 18, 22 of constant luminance and a region 20 of variable luminance that is adjacent to the two regions of constant luminance, although it is quite possible to have a basic pattern consisting of only two visibly different regions, namely a region of constant luminance adjacent to a region of variable luminance, which is repeated multiple times therefore enabling to obtain two different decorative effects from a single basic pattern.

As a variant, depending on the number of different patterns one wishes to obtain from a single basic pattern, the basic pattern consists of a plurality of regions of constant luminance and a plurality of regions of variable luminance.

In another variant, the basic pattern has an outer contour of any appropriate form, and the different regions of the basic pattern each have any appropriate form.

In another variant, the materials used to form the different regions of the basic pattern are of any type adapted to form regions of constant or variable luminance, such as dyes, pigments, paints, additives, etc.

The invention claimed is:

1. A decorated element comprising an element having a decorative outer surface, wherein the decorative outer surface comprises:
    a first region having a constant luminance equal to a first predetermined value; and
    at least a second region adjacent to the first region,
    the second region having a variable luminance which depends on the viewing angle, the variable luminance of the second region being equal to the first predetermined value for a first given viewing angle,
    wherein the outer surface comprises a third region adjacent to the second region, this third region having a constant luminance that is equal to a second predetermined value, the second predetermined value being different from the first predetermined value, and the variable luminance of the second region is equal to the second predetermined value for a second given viewing angle, the second given viewing angle being different from the first given viewing angle.

2. The decorated element according to claim 1, wherein the first region, the second region and the third region have the same color hue.

3. The decorated element according to claim 1, wherein the first region, the second region and the third region together form a basic pattern, the outer surface comprising a plurality of patterns identical to the basic pattern and adjacent to each other.

4. The decorated element according to claim 3, wherein the basic pattern is repeated over the outer surface in a first direction and in a second direction.

5. The decorated element according to claim 4, wherein the first direction and the second direction are substantially perpendicular.

6. The decorated element according to claim 1, wherein the outer surface is a three-dimensional surface having at least two areas that are simultaneously observable from different viewing angles.

7. The decorated element according to claim 1, wherein the outer surface is formed by a translucent film having a rear face opposite the outer surface, the first region, the second region and the third region being formed by materials applied to said rear face.

8. The decorated element according to claim 1, wherein the constant luminance of the third region substantially corresponds to a minimum of the variable luminance of the second region.

9. The decorated element according to claim 1, wherein the constant luminance of the first region substantially corresponds to a maximum of the variable luminance of the second region.

10. The decorated element according to claim 1, wherein the first, second and third regions together form a basic pattern from which three visual patterns which differ from each other can be observed.

11. A vehicle trim part, wherein it comprises a decorated element according to claim 1 whose outer surface is visible in a mounted state.

12. A method for manufacturing a decorated element having an outer decorative surface, wherein the method comprises the following steps:
    providing a film having a front face and a rear face, and made from a translucent plastic material;
    applying, over a first area of the rear face of the film, a first material suitable for forming a first region having a constant luminance equal to a first predetermined value;
    applying, over a second area of the film, a second material suitable for forming a second region having a variable luminance which varies with the viewing angle, the variable luminance of the second region being equal to the first predetermined value for a first given viewing angle;
    applying, over a third area of the film, a third material suitable for forming a third region having a constant luminance equal to a second predetermined value, the second predetermined value being different from the first predetermined value, and the variable luminance of the second region is equal to the second predetermined value for a second given viewing angle, the second given viewing angle being different from the first given viewing angle; and
    shaping the film such that at least a portion of the front face of the film forms the decorative surface.

13. The manufacturing method according to claim 12, wherein one of the materials is applied over an area corresponding to the entire rear face of the film.

* * * * *